United States Patent [19]

Kravitz et al.

[11] 4,001,866
[45] Jan. 4, 1977

[54] MONOLITHIC, JUNCTION ISOLATED PHOTRAC

[75] Inventors: Bernard L. Kravitz, Forest Hills; George R. Seaton, Northport, both of N.Y.

[73] Assignee: Dionics, Incorporated, Westbury, N.Y.

[22] Filed: Oct. 16, 1975

[21] Appl. No.: 622,966

Related U.S. Application Data

[63] Continuation-in-part of Ser. No. 499,534, Aug. 22, 1974, Pat. No. 3,918,083, and a continuation-in-part of Ser. No. 616,040, Sept. 23, 1974.

[52] U.S. Cl. .................................. 357/39; 357/35; 357/46; 357/40; 357/30; 357/36; 307/299 A; 307/252 UA
[51] Int. Cl.² ........................................ H01L 29/747
[58] Field of Search ............... 357/39, 35, 46, 40, 357/30, 36; 307/299 A, 252 UA

[56] References Cited

UNITED STATES PATENTS

| | | | |
|---|---|---|---|
| 3,123,750 | 3/1964 | Hutson | 317/235 |
| 3,275,846 | 9/1966 | Bailey | 307/88.5 |
| 3,475,666 | 10/1969 | Hutson | 317/235 |
| 3,535,615 | 10/1970 | Howell et al. | 323/22 |
| 3,564,291 | 2/1971 | Aagaard | 307/252 |
| 3,586,928 | 6/1971 | Bergman | 317/235 R |
| 3,684,902 | 8/1972 | Giuliano | 307/303 |
| 3,719,863 | 3/1973 | Ogawa | 317/235 R |
| 3,816,763 | 6/1974 | Korn | 307/252 UA |
| 3,893,153 | 7/1975 | Page | 357/38 |
| 3,918,083 | 11/1975 | Kravitz | 357/39 |

*Primary Examiner*—Martin H. Edlow
*Attorney, Agent, or Firm*—James J. Burke, II

[57] ABSTRACT

A photosensitive integrated circuit switch that operates in the same manner as back-to-back photosensitive SCR's. The invention combines the monolithic, junction-isolated construction of the basic photrac, described in U.S. Pat. No. 3,918,083, and the operational characteristics of a dielectrically isolated photrac, described in co-pending application Ser. No. 616,040, but incorporates the single-quadrant gate-triggering feature of the latter. Its simplified construction makes it advantageous in many applications.

8 Claims, 5 Drawing Figures

BACK TO BACK SCR DESCRIPTION $QL_3, QL_4$ LATERAL PNP
$Q11, Q12$ VERTICAL NPN

MONOLITHIC, JUNCTION ISOLATED PHOTRAC

RELATED APPLICATIONS

This application is a continuation-in-part of U.S. application Ser. No. 499,534 filed Aug. 22, 1974 (Now U.S. Pat. No. 3,918,083, issued Nov. 4, 1975) and application Ser. No. 616,040, filed Sept. 23, 1974, both of which are assigned to the same assignee as the instant application.

BACKGROUND OF THE INVENTION

The above-noted patent discloses a planar, bi-lateral switching integrated circuit comprising four vertical NPN transistors sharing a common collector, with leads between the emitters and bases of adjacent pairs. The effective circuit, shown in FIG. 1 of the accompanying drawings, is a lateral triac comprising eight transistors, the NPN's noted above and four horizontal PNP's sharing a common base, in a transistor bridge construction.

Because all junctions reach a single surface, the device can be made photosensitive. In the basic configuration it is provided with a pair of gate terminals. When a gate current is applied between one of the gate terminals and an associated main terminal, or when a light-generated photocurrent reaches a certain magnitude, the device is triggered. Because of the symmetrical construction, AC circuits may be controlled. More particularly, a single gate current can trigger the device in both quadrants I and III.

This device is called a "photrac" because it can best be described as a photosensitive triac.

The basic photrac circuit (FIG. 1) is necessarily a junction isolated device, though it will be appreciated that the whole device could be included in a dielectrically isolated circuit including other elements. In the basic circuit one transistor in each pair will block in either direction depending on its biasing. Its function in the blocking state, however, is essentially that of a diode. In its active state, of course, it functions as a transistor. A dielectrically isolated or DI photrac can be constructed employing discrete diodes replacing two of the integral transistors of the basic structure, the diodes functioning only as diodes, and this is described in the above-mentioned co-pending application, and is shown in FIG. 2. A pair of transistors Q9, Q10 are constructed in common collector configuration, with diodes D1, D2 across their respective emitter and base terminals. The main terminals are connected to the respective emitters, and the device is gated at the respective bases. A lateral PNP transistor QL is inherently part of the structure. Those skilled in the art will perceive that this device, in operation, will be similar to a pair of SCR's in the inverse-parallel or "back-to-back" mode.

A simple and effective method of constructing this device is dielectric isolation (DI). A polycrystalline silicon matrix is provided with three "tubs" of single crystal N-type silicon buried therein, each tub being entirely surrounded by a layer of silicon dioxide which insulates it from the matrix. The techniques for producing such dielectrically isolated structures are well-known in the art and need not be detailed herein. The bases of the transistors Q9, Q10, and the "P" sides of the diodes D1, D2 may be formed in a single diffusion of P-type impurities. A diffusion of N-type impurities is then carried out to form the emitter regions of the transistors. The lateral PNP transistor QL is formed inherently. Application of leads etc. is conventional.

The advantages of the basic photrac (FIG. 1), including gate triggering or light triggering and monolithic construction, are manifest. The high voltage capacities afforded by dielectric isolation, as in the FIG. 2 device, are also clear. However, in many applications these combined features are not required. More particularly, it has been perceived that from an applications point of view and for economy of production, there is need for a junction isolated device that functions as back-to-back SCR's, but one in which each gate can trigger only in a single quadrant, or, which can be light-triggered only (e.g. with floating gates). In other words, a device that functions like the DI photrac (FIG. 2) but is built like the basic photrac (FIG. 1) is useful, and that is what the present invention accomplishes.

OBJECTS OF THE INVENTION

An object of the present invention is to provide a simplified, monolithic, junction isolated photrac.

Another object of the present invention is to provide a photrac which functions as a photosensitive pair of back-to-back SCR's, but which is of simple, monolithic construction.

Various other objects and advantages of the invention will become clear from the following description of embodiments thereof and the novel features will be particularly pointed out in connection with the appended claims.

THE DRAWINGS

Reference will be made herein to the accompanying drawings wherein:

FIG. 1 is a circuit diagram of the basic photrac;
FIG. 2 is a circuit diagram of a DI photrac;
FIG. 3 is a circuit diagram of a photrac in accordance with the present invention;
FIG. 4 is a block diagram showing conductivity types for the FIG. 3 photrac; and
FIG. 5 is a plan view of a photrac of the FIG. 3 type.

DESCRIPTION OF THE EMBODIMENTS

Figure 2:
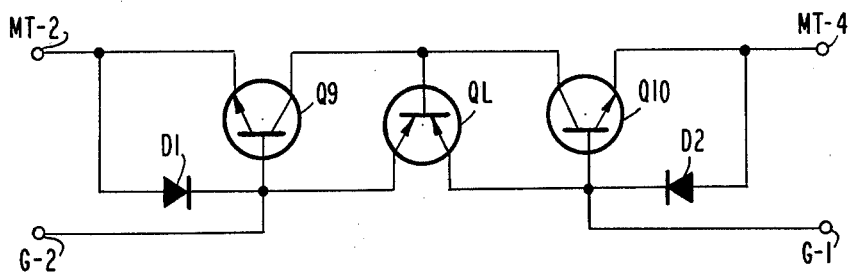

The dielectric isolation of the FIG. 2 photrac is required because junction isolation is insufficient to isolate diodes D1 and D2 from the remainder of the structure. The present invention is based on the replacement of diodes D1, D2 by lateral PNP transistors, very much in the spirit, if not the exact same manner, as in the basic, monolithic photrac.

Figure 4:
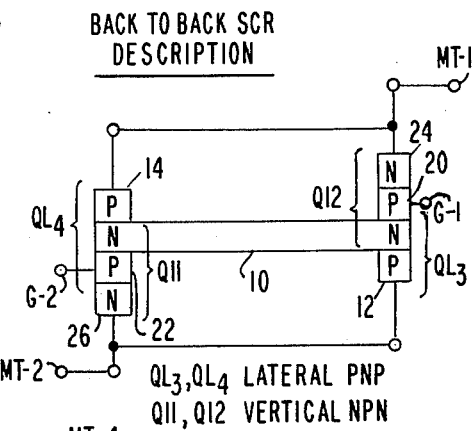

The invention may be more readily understood by considering first the simplified block diagram, FIG. 4, and attention is directed thereto. It will be appreciated that conductivity types may be reversed, as is conventional in this technology.

Two vertical NPN transistors Q11 and Q12 are formed in a single piece of silicon 10 in common collector configuration. A lateral PNP transistor QL2 (FIG. 3) is inherently formed by this operation. This structure is identical to transistors Q9, Q10 and QL of FIG. 2. Rather than discrete diodes D1, D2, however, two additional P zones 12, 14 are provided in adjacent areas of the same N-type starting material 10. Were these isolated from transistor Q11, Q12 they would form diodes, but they are not; as a result, two more lateral PNP's, QL3 and QL4, are created. A lead 16 connects P zone 12 across the emitter of Q11, and a lead 18 connects P zone 14 across the emitter of Q12.

Figure 1:
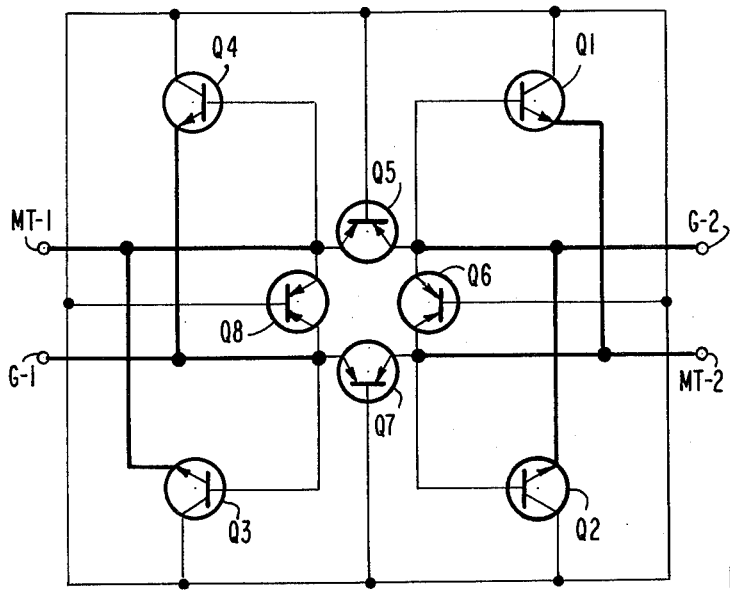
Figure 3:
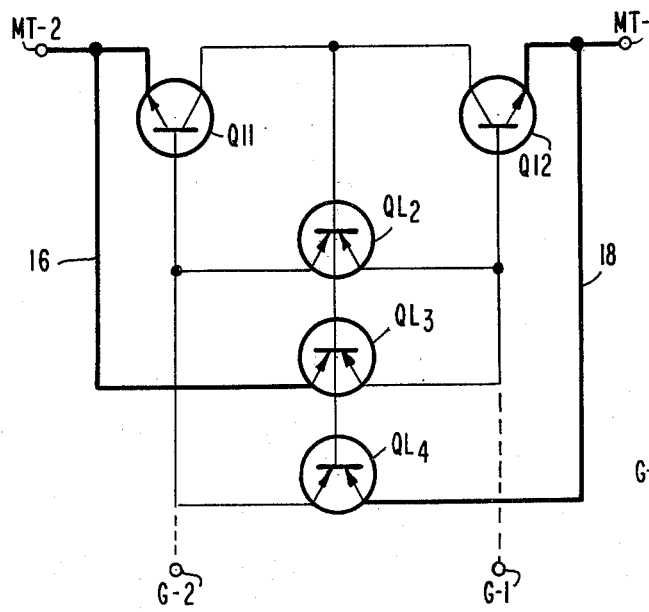

The resulting circuit is shown in FIG. 3. As in FIG. 1, the external leads are shown in heavy lines and internal connections formed inherently are in light lines.

As is clear by comparison with FIG. 2, transistors Q11, Q12 and QL2 are in the same geometric and functional relation as transistors Q9, Q10 and QL. All of the lateral transistors have a common N base (10) and share other integral portions with the vertical phototransistors.

Figure 5:
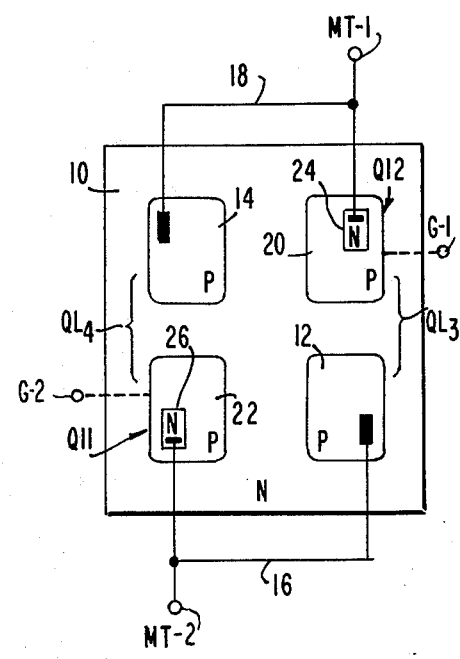

The circuit appears rather complex in schematic form but, in reality, is remarkably simple, and attention is directed to FIG. 5, which is a plan view of a device embodying the invention. Thus, the starting block of N-type silicon 10 has four symmetrical and identical P zones 12, 14, 20, 22 diffused therein. Two N-type emitter zones 24, 26 are then diffused into zones 20, 22 respectively, thus completing transistor Q11 and Q12. The lateral, bipolar PNP transistors are inherently formed as follows: QL2 comprises zones 20-10-22; QL3 comprises 20-10-12 and QL4 comprises 14-10-22.

As in the FIG. 2 device, the main terminals MT1, MT2 are connected to the emitters of the vertical NPN's. In operation, the device functions just as in the FIG. 2 circuit, e.g. the same as back-to-back SCR's. This can best be seen with reference to FIG. 4. More particularly, when MT-2 is positive with respect to MT-1, the SCR formed by the combination of vertical NPN transistor Q12 and lateral PNP transistor QL3 is biased in its normal operating mode; i.e.: positive anode and negative cathode. As such, it will function as a conventional photosensitive SCR which may be triggered into a latching conduction state by the injection of photon generated carriers (or, if gate contacts are supplied, by injected gate current).

The second SCR in the structure (composed of Q11 and QL4) is reversed biased at this time. (positive on cathode; negative on anode). A reverse of polarity at MT-1 and MT-2 will reverse the bias on the two SCR's, and, regardless of polarity at any given time, one will always be in the forward biased state while the other will be reverse biased.

Optional gate contacts G1, G2 may be made to base regions 20 and 22 to allow for gate triggering as well as photon triggering. Such individual gates however, would not, as with conventional SCR gates, be capable of the multi-quadrant control (triac control) that can be achieved with the gates of the more complete photrac structure shown in FIG. 1.

Impurity concentrations and other parameters for this invention are conventional, and of the same order as disclosed in the above-noted patent and co-pending application. As also disclosed in the patent and application, it is preferred to diffuse the P zones in two stages. One stage is a normal base diffusion, and the other, which is through a larger mask so as to surround the first base, is two to four orders of magnitude lower in impurity concentration, and no higher than about $10^{16}$ atoms/cc. This improves voltage characteristics, raising breakdown voltage well above normal AC line voltages. As applied in the present invention, this double diffusion would be carried out on zones 12, 14, 20 and 22. The method of high voltage diffusion is described in detail in U.S. Pat. No. 3,920,493 issued Nov. 18, 1975, and devices including same are disclosed in U.S. application Ser. No. 416,170 filed Nov. 15, 1973, both assigned to the same assignee as the instant application.

It will be appreciated that in the construction of any photosensitive semiconductive devices, certain well-recognized expedients should be observed to maximize the efficiency of photocurrent generation. For example, light-blocking films (i.e. leads) should be minimized, junction geometry should be balanced for maximum light absorption and emitter injection efficiency, and base materials having long minority carrier lifetimes should be used. These considerations are applicable in the photosensitive circuits made in accordance with the present invention. It will be further appreciated that while the symmetrical arrangement of phototransistors Q11, Q12 and adjacent P zones 12, 14 shown in FIG. 5 is preferred, this is not critical to operation of the device.

Various changes in the details, steps, materials and arrangement of parts which have been herein described and illustrated to explain the nature of the invention, may be made by those skilled in the art within the principle and scope of the invention as defined in the appended claims.

What is claimed is:

1. A monolithic, junction-isolated photrac comprising:
   a body of semiconductor material of a first conductivity type;
   a pair of transistors formed in said body and having said body as a common collector;
   a pair of zones of opposite conductivity type formed in said body adjacent said transistors;
   means for connecting the emitters of said transistor pair across a power source; and
   means connecting each said opposite conductivity zone to one said emitter.

2. The photrac as claimed in claim 1, wherein said transistor pair comprises:
   a pair of base zones of opposite conductivity type reaching a surface of said body and forming a PN junction therewith;
   an emitter zone of said first conductivity type reaching said surface in each of said base zones and forming PN junctions therewith;
   said transistor pair and said adjacent opposite conductivity zones inherently forming three, lateral, bipolar transistors of opposite conductivity type to said transistor pair, said bipolar transistors having a common base comprising said body.

3. The photrac as claimed in claim 1, wherein said transistor pair are photosensitive transistors.

4. The photrac as claimed in claim 2, and additionally comprising a pair of gate terminals connected to the bases of said transistor pair.

5. The photrac as claimed in claim 2, wherein said phototransistor base zones and said adjacent zones are symmetrically arranged in said body.

6. The photrac as claimed in claim 2, wherein the base zones of said phototransistor pair and each said opposite conductivity zone comprise first and second regions of second conductivity type, the second region surrounding said first region on said surface, and having an impurity concentration of from two to four orders of magnitude less than said first region, and in no event more than $10^{16}$ atoms/cc.

7. A photrac comprising:
   first and second phototransistors connected in common collector configuration;
   first, second, and third lateral bipolar transistors having bases connected to said unipolar common collector;

said first bipolar transistor connected across the bases of said phototransistor;

said second bipolar transistor connected from the base of said second phototransistor to the emitter of said first phototransistor;

said third bipolar transistor connected from the base of said first phototransistor to the emitter of said second phototransistor; and means for connecting the emitters of said unipolar transistors across a power source.

8. The photrac as claimed in claim 7, and additionally comprising a pair of gate terminals connected to the bases of said phototransistors.

* * * * *